United States Patent [19]

Masamura et al.

[11] Patent Number: 4,554,672

[45] Date of Patent: Nov. 19, 1985

[54] PHASE AND FREQUENCY VARIABLE OSCILLATOR

[75] Inventors: Tatsuro Masamura; Masahiro Morikura, both of Kanagawa; Takayoshi Maki, Fukuoka, all of Japan

[73] Assignee: Nippon Telegraph & Telephone Public Corp., Tokyo, Japan

[21] Appl. No.: 582,215

[22] Filed: Feb. 21, 1984

[30] Foreign Application Priority Data

Feb. 21, 1983 [JP] Japan .................................. 58-26340
Nov. 15, 1983 [JP] Japan ................................ 58-213298

[51] Int. Cl.$^4$ ........................... H04B 7/02; H03L 7/00
[52] U.S. Cl. ..................................... 375/40; 375/119; 331/1 A
[58] Field of Search ................... 375/40, 97, 118, 119, 375/107, 109; 455/52, 132, 12; 364/607, 721; 331/1 A, 14; 370/104

[56] References Cited

U.S. PATENT DOCUMENTS

| | | | |
|---|---|---|---|
| 3,633,017 | 1/1972 | Crooke | 364/721 |
| 3,828,138 | 8/1974 | Fletcher et al. | 375/97 |
| 4,099,121 | 7/1978 | Fang | 375/40 |
| 4,159,526 | 6/1979 | Mosley, Jr. et al. | 364/721 |
| 4,291,269 | 9/1981 | Nossen | 375/97 |
| 4,338,574 | 7/1982 | Fujita et al. | 331/1 A |
| 4,464,638 | 8/1984 | Crowley et al. | 331/1 A |
| 4,485,477 | 11/1984 | Nossen | 375/97 |
| 4,498,059 | 2/1985 | Edwards et al. | 331/1 A |

Primary Examiner—Robert L. Griffin
Assistant Examiner—Stephen Chin
Attorney, Agent, or Firm—Armstrong, Nikaido, Marmelstein & Kubovcik

[57] ABSTRACT

An improved oscillator which can adjust phase and frequency of the output signal independently from each other without time delay is disclosed. The oscillator is used for instance as a clock signal generator in a TDMA satellite communication system. The oscillator (FIG. 3) comprises a fixed oscillator (13) for providing a fixed frequency signal, a quadrature hybrid circuit (14) for providing a pair of quadrature phased signals from the output of said fixed oscillator (13), a control signal generator (17) for providing a pair of quadrature phased signals which satisfy b cos $(2\pi \Delta f_D t + \Delta \phi_D)$ and b sin $(2\pi \Delta f_D t + \Delta \phi_D)$, where b is a constant, $\Delta f_D$ is a desired frequency change, and $\Delta \phi_D$ is a desired phase change, a pair of mixers (15,16) for providing products of each output of the quadrature hybrid circuit (14) and each output of the control signal generator (17), and an in-phase power combiner (20) for combining the outputs of the mixers (15,16) to provide a controlled output signal which satisfies ab sin $[2\pi(f_O + \Delta f_D)t + (\phi_O + \Delta \phi_D)]$, where a, $f_O$ and $\phi_O$ are constants.

5 Claims, 9 Drawing Figures

Fig. 2
PRIOR ART
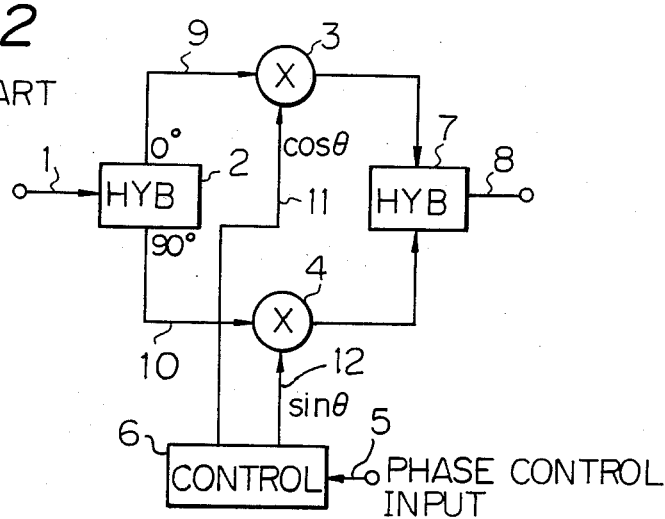
Fig. 8
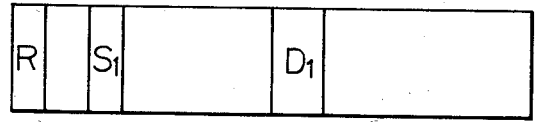
(a)
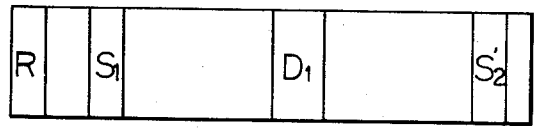
(b)
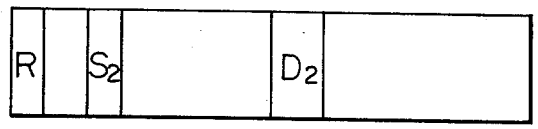
(c)

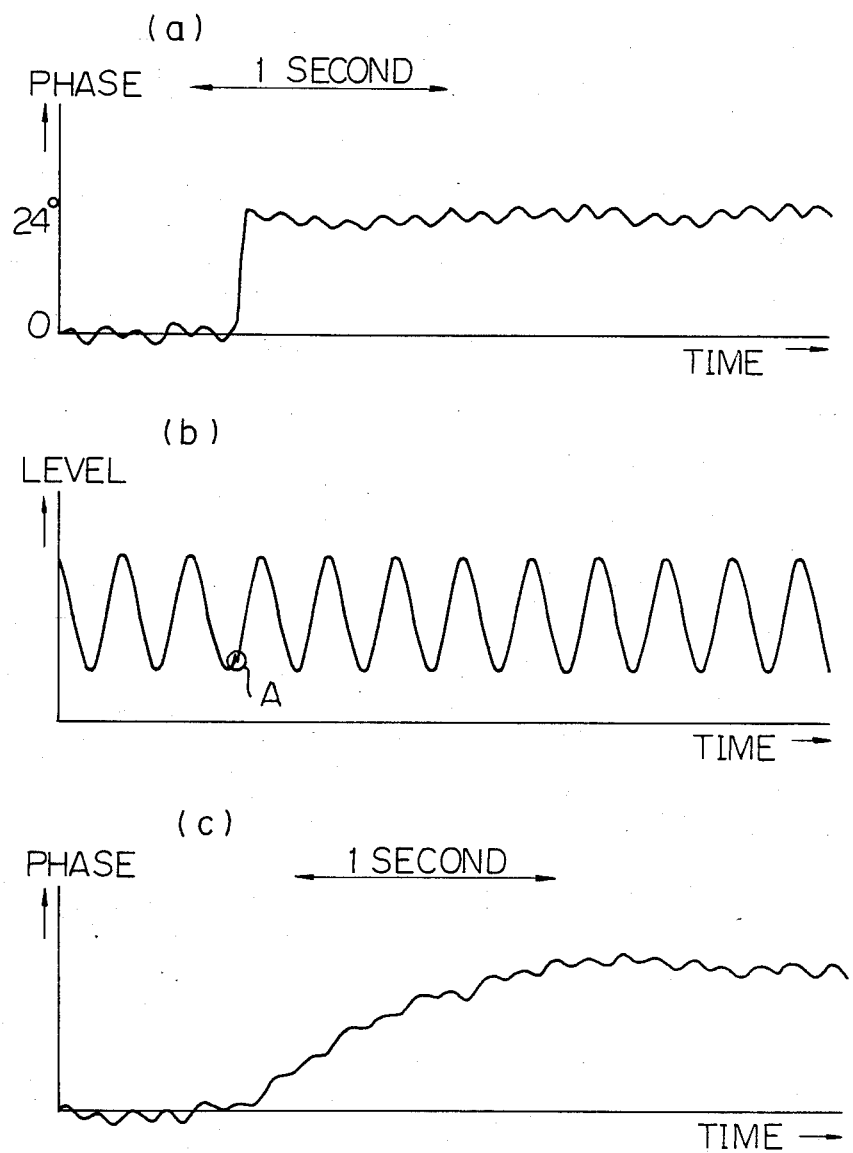

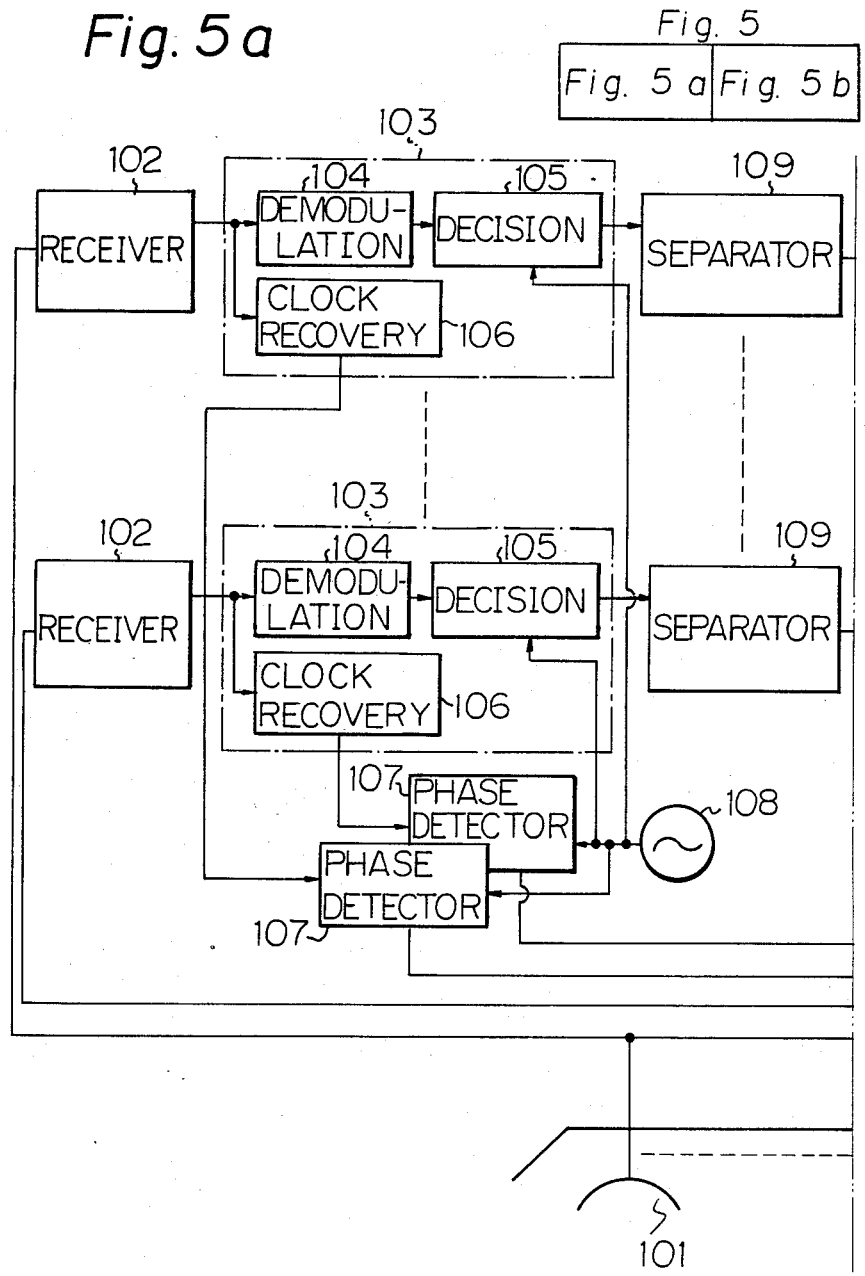

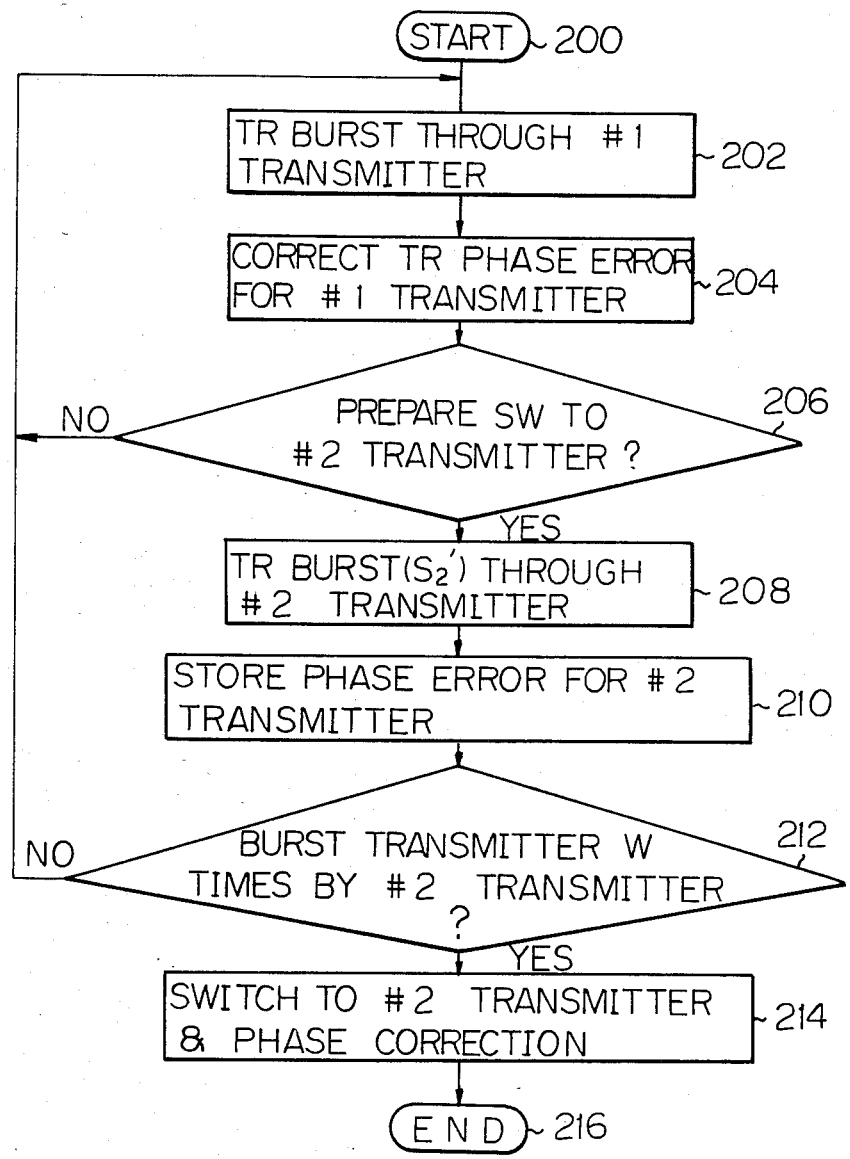

PHASE AND FREQUENCY VARIABLE OSCILLATOR

BACKGROUND OF THE INVENTION

The present invention relates to a phase and frequency variable oscillator which can adjust both phase and frequency of the output signal independently from each other control value without time delay.

One of the prior variable oscillators is a voltage controlled oscillator (OSC) which adjusts the frequency in order to obtain the desired phase. When the phase output of FIG. 1(a) is desired, the control voltage (b) as shown in FIG. 1(b) is applied to the voltage controlled oscillator. Then, the output phase leads or laggs as shown in FIG. 1(c). When the phase reaches the desired value, the control voltage is stopped as shown in FIG. 1(b). However, a voltage controlled oscillator as shown in FIGS. 1(a) through 1(c) has the disadvantages that some time delay $T_d$ is inevitable in order to reach the desired phase and no step change of the phase without time delay is obtained. Furthermore, the accuracy of a voltage controlled oscillator is not satisfactory.

Another prior type is an endless phase shifter as shown in FIG. 2, in which reference numeral (1) is an input terminal, (2) is a quadrature hybrid circuit for providing a pair of quadrature phased outputs, (3) and (4) are mixers, (5) is a control signal input terminal, (6) is a control circuit for providing DC voltages (11) and (12) related to the control signal (5), (7) is an in-phase power combiner, and (8) is an output terminal.

Assuming that the input signal at the terminal (1) is;

$$A(t) = a' \sin(2\pi f_0 T + \phi_0')$$

then, the outputs (9) and (10) of the quadrature hybrid circuit (2) are;

Signal 9 a $\sin(2\pi f_0 t + \phi_0)$

Signal 10 a $\cos(2\pi f_0 t + \phi_0)$ where (a) and ($\phi_0$) are determined by (a') and ($\phi_0'$). When a phase lead of $\theta$ is desired, the control signals (11) and (12) of the control circuit (6) are shown below.

Signal 11 b $\cos \theta$

Signal 12 b $\sin \theta$

The output signal at the output terminal (8) is shown below.

$$B(t) = ab[\sin(2\pi f_0 t + \phi_0)\cos\theta + \cos(2\pi f_0 t + \phi_0)\sin\theta]$$
$$= ab \sin(2\pi f_0 t + \phi_0 + \theta)$$

The output signal B(t) has a phase lead of $\theta$ with respect to the input signal A(t).

Although a prior endless phase shifter can adjust the phase of a signal arbitrarily, it has the disadvantage that the frequency of the signal is not adjusted.

SUMMARY OF THE INVENTION

It is the primary object of the present invention to overcome the disadvantages and limitations of any prior frequency and/or phase control systems by providing a new and improved frequency and phase variable oscillator.

It is also an object of the present invention to provide a frequency and phase variable oscillator which can adjust both frequency and phase quicky without time delay.

The above and other objects are attained by a frequency and phase variable oscillator comprisng; (a) a fixed oscillator, (b) a quadrature hybrid circuit coupled with the output of said fixed oscillator for providing a pair of quadrature phased signals, (c) a first control input for accepting a frequency control signal ($\Delta F_D$), (d) a second control input for accepting a phase control signal ($\Delta \phi_D$), (e) a control signal generator for providing a pair of quadrature phased control signals which depend upon said frequency control signal and said phase control signal, (f) a first mixer for providing a product of one of the outputs of said quadrature hybrid circuit and one of the outputs of said control signal generator, (g) a second mixer for providing a product of another output of said quadrature hybrid circuit and another output of said control signal generator, (h) a power combiner for providing in-phase power combination of the outputs of said first mixer and said second mixer, and (i) an output terminal coupled with said power combiner to provide a controlled output signal.

BRIEF DESCRIPTION OF THE DRAWINGS

The foregoing and other objects, features, and attendant advantages of the present invention are explained by means of the following description and accompanying drawings; wherein, FIG. 2 is a block diagram of an endless phase shifter, FIG. 4 shows operational waveforms of the present phase and frequency variable oscillator, together with a similar waveform of a prior system, FIGS. 5A and 5B are block diagram of a transponder on a satellite, using the present phase and frequency variable oscillator, FIG. 7 is an operational flow diagram showing the operation of the apparatuses of FIG. 5 and FIG. 6, and FIG. 8 shows frame formats used in the present invention.

DESCRIPTION OF THE PREFERRED EMBODIMENT

Figure 1:
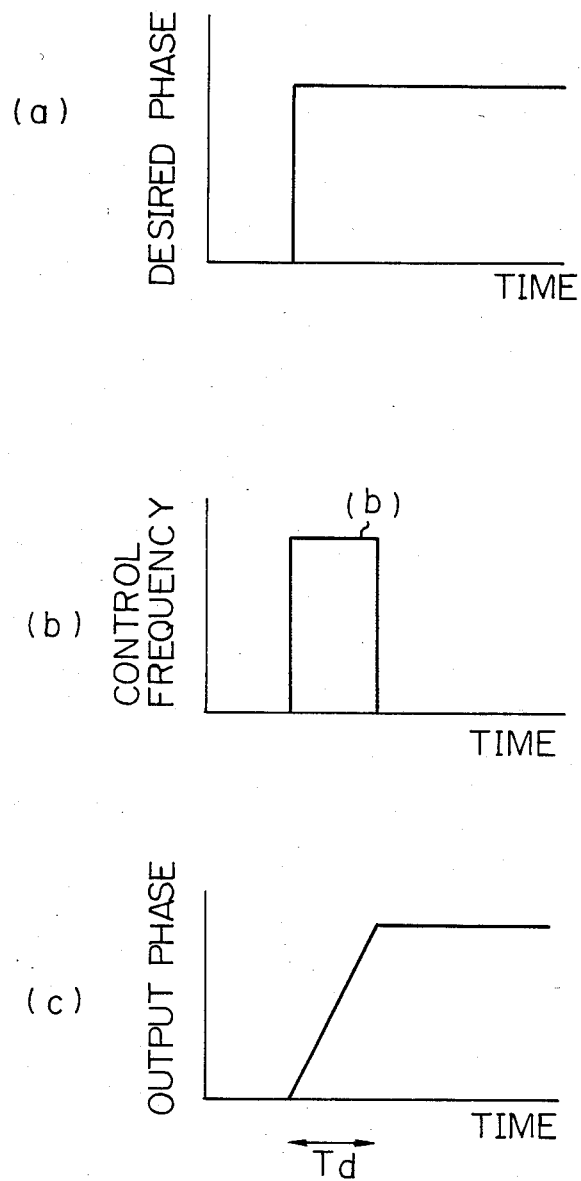
FIG. 1 shows waveforms of a prior voltage controlled oscillator type variable oscillator.
Figure 3:
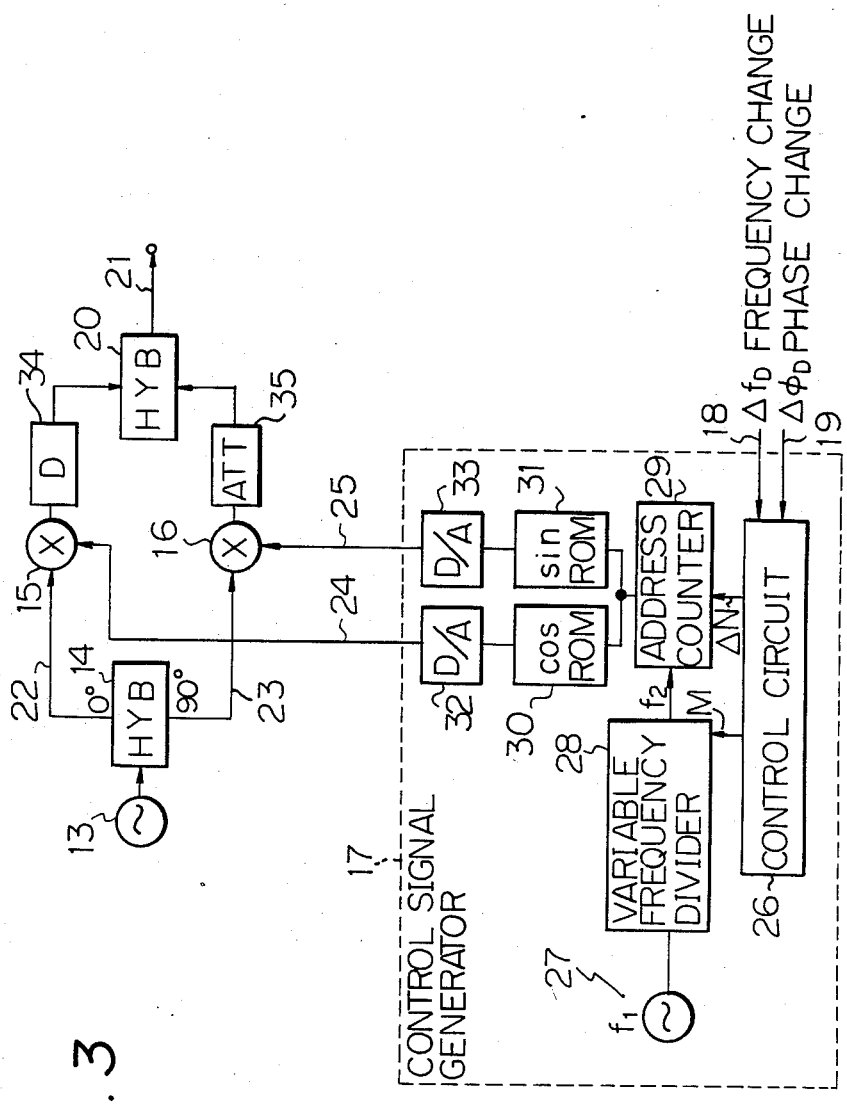
FIG. 3 is a block diagram of the phase and frequency variable oscillator of the present invention.

FIG. 3 is a block diagram of the present phase and frequency variable oscillator, in which reference numeral (13) is a fixed oscillator with high stability, (14) is a quadrature hybrid circuit for providing a pair of quadrature phased output signals, (15) and (16) are mixers each providing product of two input signals, (17) is a control signal generator for providing control signals (24) and (25) according to the desired frequency control input signal (18) ($\Delta f_D$) and the desired phase control input signal (19) ($\Delta \phi_D$), (20) is a power combiner for providing in-phase combination of outputs of the mixers (15) and (16), (21) is the output signal, (22) and (23) are output signals of the quadrature hybrid circuit (14), numeral (34) is a delay circuit, and (35) is an attenuator. The delay circuit (34) and the attenuator (35) are provided between the output of the mixer and the input of the combiner so that the timing and the level of the two inputs of the combiner are equal to each other. The delay circuit and the attenuator can be removed when the timing and level of the two inputs of the combiner are equal to each other.

Assuming that the desired frequency control signal at input (18) is $\Delta f_D$, and the desired phase control signal at input (19) is $\Delta\phi_D$, then, the control signal generator (17) provides control signals (24) and (25) such that, Signal 24 b cos $(2\pi\Delta f_D t + \Delta\phi_D)$
Signal 25 b sin $(2\pi\Delta f_D t + \Delta\phi_D)$ On the other hand, assuming that output A(t) of the fixed oscillator (13) is A(t)=a' sin $(2\pi f_0 t + \phi_0')$, outputs (22) and (23) of the quadrature hybrid circuit (14) are;

Signal 22 a sin $(2\pi f_0 t + \phi_0)$
Signal 23 a cos $(2\pi f_0 t + \phi_0)$ where (a) and ($\phi_0$) are constants which are defined by a' and $\phi_0'$.

Accordingly, output signal B(t) at the output (21) is shown below.

$$B(t) = ab[\sin(2\pi f_0 t + \phi_0)\cos(2\pi\Delta f_D + \Delta\phi_0) + \cos(2\pi f_0 t + \phi_0)\sin(2\pi\Delta f_D t + \Delta\phi_D)]$$
$$= ab \sin[2\pi(f_0 + \Delta f_D)t + (\phi_0 + \Delta\phi_D)]$$

It should be noted that in the above equation, output signal B(t) has the desired frequency change, $\Delta f_D$, and the desired phase change, $\Delta\phi_D$.

The control signal generator (17) for providing the outputs (24) and (25) has a control circuit (26), a fixed oscillator (27), a variable frequency divider (28), an address counter (29), a read-only-memories (ROM) (30) and (31) which store the sine and cosine value respectively, for one cycle and digital/analog converters (D/A); (32) and (33).

The control signals (24) and (25) are provided by reading out the ROM's (30) and (31) cyclically according to the address provided by the address counter (29). The frequency of the control signals (24) and (25) is adjusted by varying the sweeping speed of the address counter (29) according to the desired frequency change ($\Delta f_D$) and the phase of the control signals (24) and (25) is adjusted by skipping the address of the address counter (29) by an amount proportional to the desired phase change ($\Delta\phi_D$).

The control circuit (26) determines the divisor (M) according to the desired frequency change ($\Delta f_D$) so that the following equation is satisfied.

$$\Delta f_D = f_2/L = f_1/(LM)$$

where $f_1$ is the output frequency of the fixed oscillator (27), $f_2$ is the output frequency of the variable frequency divider (28), L is a constant which is the number of samples in the ROM's (30) and (31) which correspond to a single cycle of the sine and cosine waves. The value of L is, for instance, 512.

The divisor (M) is applied to the divider (28), which provides the frequency ($f_2$) to the address counter (29). The content of the address counter (29) is incremented every period that is equal to $1/f_2$, and the contents of the ROM's (30) and (31) are read out every period ($=1/f_2$). This provides the information corresponding to the desired frequency change ($\Delta f_D$).

When the phase change, $\Delta\phi_D(\neq 0)$, is provided at the input (19), the output address of the address counter (29) skips by $\Delta N$ which satisfies the following formula;

$$\Delta\phi_D = (2\pi/L)(\Delta N - 1)$$

Due to the sudden change of the address by $\Delta N$, the phase of the outputs of the ROM's (30) and (31) changes suddenly by an amount equal to the desired phase change $\Delta\phi_D$. Then, the ROM's (30) and (31) are read out every period ($=1/f_2$) as they are.

The outputs of the ROM's (30) and (31) are converted to analog signals by D/A converters (32) and (33), respectivey, and the outputs (24) and (25) of the converters are;

Signal 24 b cos $(2\pi\Delta f_D t + \Delta\phi_D)$
Signal 25 b sin $(2\pi\Delta f_D t + \Delta\phi_D)$ The stability of the output signal at the terminal (21) is in effects the same as the stability of the oscillator (13) as described below.

Assuming that the long term stability of the fixed oscillator (13) is $S_{L0}$, and that of the other fixed oscillator (17) is $S_L$, the long term stability of the output signal at the terminal (21) is shown below.

$$S_{Lt} = (f_0 S_{L0} + \Delta f_D S_L)/(f_0 + \Delta f_D)$$

Therefore, if $f_0 >> \Delta f_D$ is satisfied, $S_{Lt} \approx S_{L0}$ is obtained, which means that the long term stability of the output signal is equal to the long term stability of the fixed oscillator (13). Furthermore, assuming that the short term stability of the fixed oscillator (13) is $S_{s0}$ and the short term stability of the fixed oscillator (17) is $S_s$, the short term stability of the output signal (21) is;

$$S_{st}^2 \approx S_{s0}^2 + S_s^2 x (f_1/f_2)^2 \approx S_{s0}^2 (f_0 >> f_1)$$

Therefore, the short term stability of the output signal is, in effect, equal to the short term stability of the fixed oscillator (13). Thus, both the long term stability and the short term stability of the output signal are equal to those of the fixed oscillator (13).

According to the preferred embodiment, the D/A converters (32) and (33) are implemented by an integrated circuit (DAC82KG) produced by Burr-Brown Co. in U.S.A., the ROM's (30) and (31) are implemented by an integrated circuit (2716) produced by INTEL Co. in U.S.A., the address counter (29), the divider (28) and the control circuit (26) are implemented by the combination of three integrated circuits (8755A, 8085A and 8156) produced by said INTEL Co. The period for reading out the ROM's is 6 milli-seconds and the output frequency ($f_1$) of the oscillator (27) is 3 MHz.

Further, it is preferable to provide a delay circuit between one of mixers (15) and (16), and the combiner (20) so that in-phase combination is completely accomplished, and further it is still preferable to provide an attenuator between one of mixers (15) and (16), and the combiner (20) so that two input levels of the combiner (20) are equal to each other.

FIG. 4 shows curves of the experimental result of the present invention, in which the fixed frequency of the oscillator (13) is 35 MHz, and the desired phase change is 24°. The curve (a) of FIG. 4 shows the phase of the output signal B(t), and it should be noted that the output phase reaches the desired value very quickly. The curve (b) of FIG. 4 shows the waveform of the output signal of the present invention, and it should be noted that the phase is not continuous at portion A. The curve (c) of FIG. 4 shows an output phase of a prior phase lock loop having a voltage controlled oscillator, and it should be noted that it takes almost one second to reach the desired phase.

As described above in detail, the present invention provides a phase and frequency variable oscillator which can adjust both phase and frequency in a very short time, and it operates very stably.

Next, one of the applications of the present phase and frequency variable oscillator is described. The application example is a clock signal switching system in a satellite communication system, using a regenerative transponder, when a standby transmitter is installed in an earth station. It is assumed that the communication system uses a clock coherent synchronization system, and that the clock signal of the operational apparatus is slightly different in phase from that of the standby apparatus. The present invention switches a clock signal between the operational apparatus and the standby apparatus without communication blocking.

Figure 5B:
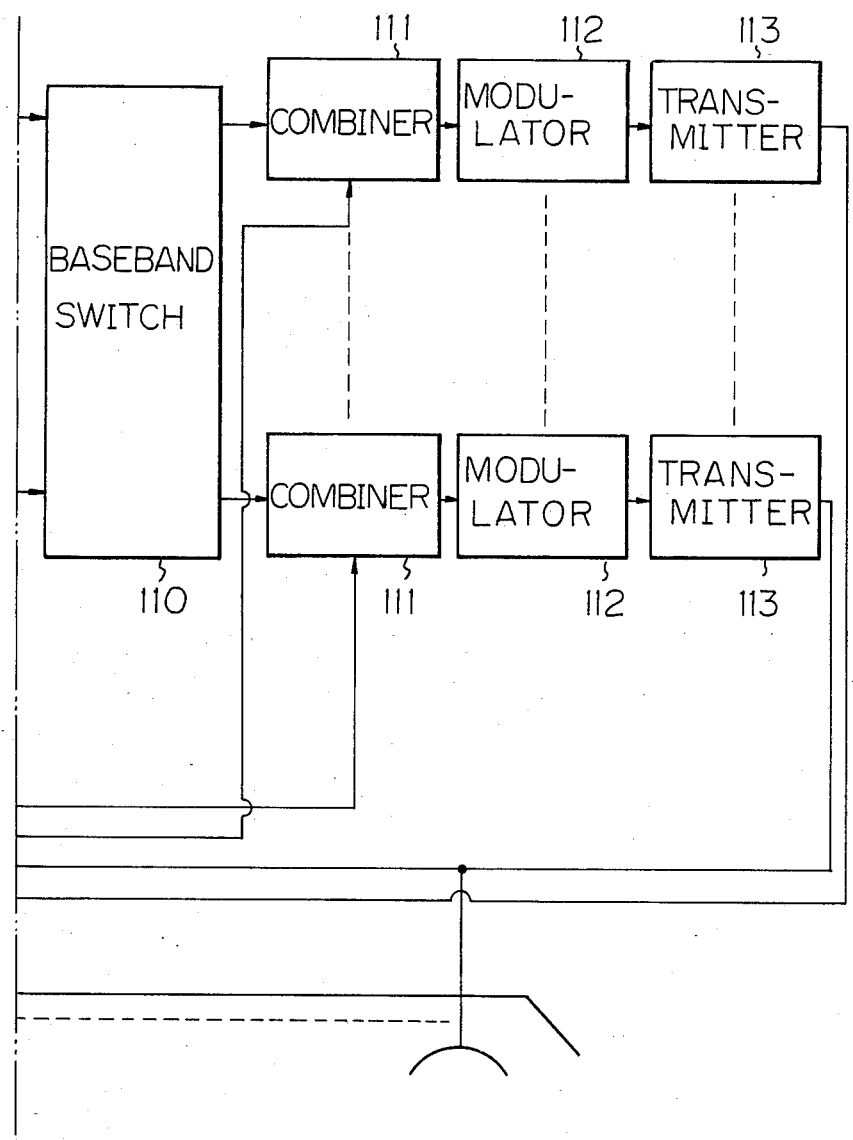

FIG. 5 shows a block diagram of a satellite system according to the present invention, in which the reference numeral (101) is an antenna for transmission and reception, (102) is a receiver, (103) is a regenerative repeater, (104) is a demodulator, (105) is a decision circuit, (106) is a clock recovery circuit, (107) is a phase detector, (108) is a clock signal generator, (109) is a signal separator, (110) is a baseband switch, (111) is a signal combiner, (112) is a modulator, and (113) is a transmitter. In the apparatus shown in FIG. 5, phase detector (107) compares the phase of the output of the clock signal generator (108) and the phase of the output signal of the clock recovery circuit (106) which derives its clock signal from the received signal. The output signal of the phase detector (107) is the difference between the phase of the generator (108) and the phase of the received signal. The phase difference signal, or the phase error signal, of the output of the phase detector (107) is combined with other burst data in the signal combiner (111), and is transmitted to the earth station through the modulator (112) and the transmitter (113) to control the clock signal of the earth station.

Figure 6:
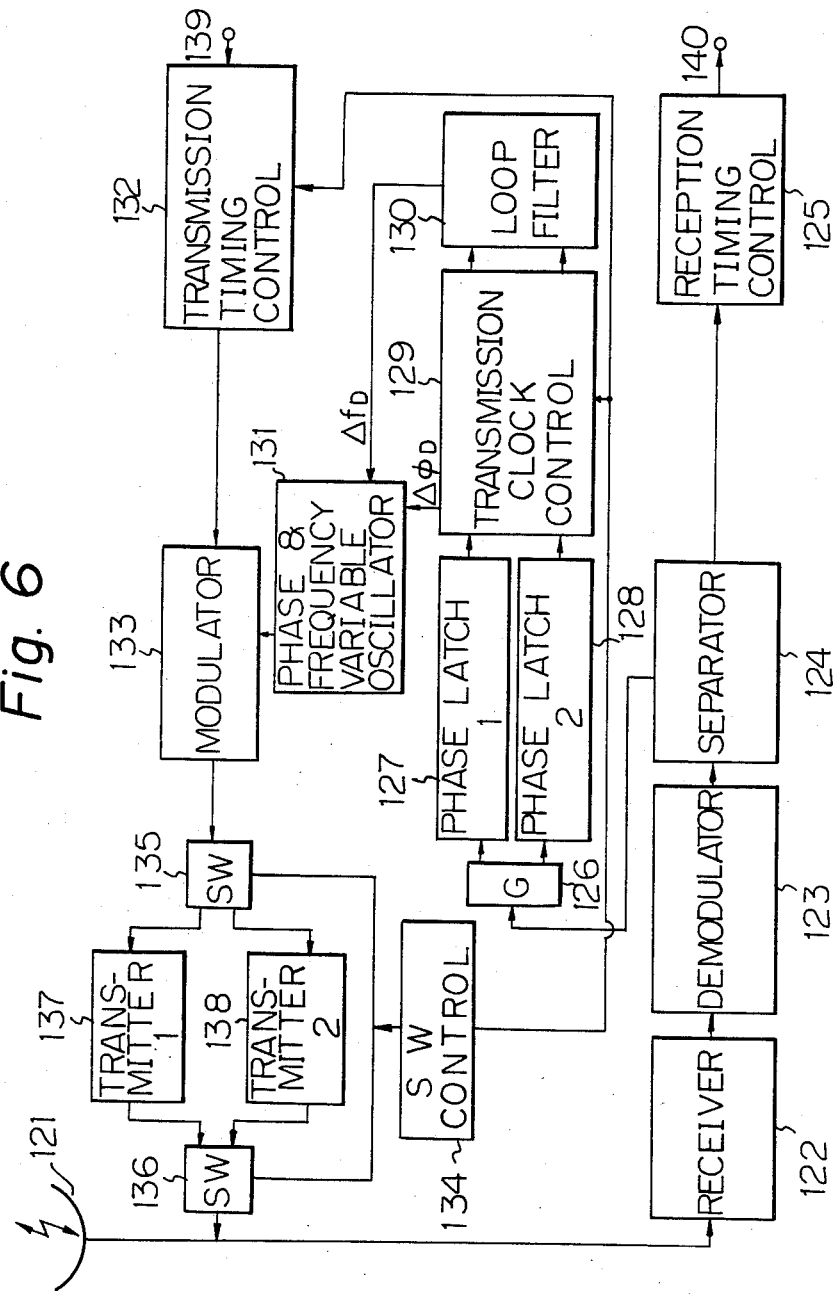
FIG. 6 is a block diagram of an earth station which uses the present phase and frequency variable oscillator.

FIG. 6 is a block diagram of an earth station incorporating the present invention, in which the reference numeral (121) is an antenna for transmission and reception, (122) is a receiver, (123) is a demodulator, (124) is a signal separator, (125) is a reception timing control circuit, (126) is a gate circuit, (127) is a phase-latch circuit for the primary transmitter (137), (128) is a phase-latch circuit for the secondary transmitter (138), (129) is a transmission clock control, (130) is a loop filter, (131) is a phase and frequency variable oscillator which is shown in FIG. 3, (132) is a transmission timing control circuit, (133) is a modulator, (134) is a switching control, (135) and (136) are switching circuits, (137) is the primary transmitter, and (138) is the secondary transmitter. Also, numeral (139) is an input terminal for accepting a transmission baseband signal, and (140) is an output terminal for providing a received baseband signal. The numeral (131) is the phase and frequency variable oscillator of FIG. 3 and accepts phase control signal $\Delta\phi_D$ and frequency control signal $\Delta f_D$ from the loop filter (130) and the transmission clock control (129).

It is assumed that the primary transmitter (137) in FIG. 6 is active, and the secondary transmitter (138), is in standby. The receiver (122) of FIG. 6 receives the signal from the satellite through the antenna (121), and converts the frequency of the received signal to the intermediate frequency. The demodulator (123) demodulates the intermediate frequency signal to a baseband signal. The signal separator (124) extracts the phase error signal provided by the phase detector (107) (FIG. 5) from a data burst. The data burst itself is sent to the terminal (140) as a reception baseband signal through the reception timing control circuit (125). The separated phase error signal is latched in the primary phase latch circuit (127) through the gate circuit (126). According to the phase error signal latched in the circuit (127), the transmission clock control (129) provides the phase change signal ($\Delta\phi_D$) and the frequency change signal ($\Delta f_D$) to the phase and frequency variable oscillator (131). The phase change signal ($\Delta\phi_D$) is applied to (131) through the loop filter (130). Thus, the adjusted clock signal is obtained at the output of circuit (131), and is used for transmission to the satellite.

FIG. 7 shows the operational flow diagram of the present system when the primary transmitter (137) is switched out and the secondary transmitter (138) is switched in FIG. 8 shows the frame formats in which the symbol R shows a synchronization burst from a reference earth station, $S_1$ and $S_2$ show synchronization bursts from a non-reference station, $D_1$ and $D_2$ show data bursts from a non-reference station, and $S_2'$ shows an auxiliary burst from a non-reference station.

The operation of each box in FIG. 7 is as follows.
200; Start
202; Transmission of a burst through the primary transmitter (137).
204; Correction of transmission phase error for the primary transmitter (137).
206; Preparation for switching to the secondary transmitter (138).
208; Transmission of an auxiliary burst ($S_2'$) through the secondary transmitter (138).
210; Storage of phase error for the secondary transmitter (138).
212; Check if the secondary transmitter (138) transmitted a burst W times.
214; Switching to the secondary transmitter (138) and correction of transmission phase error.
216; End.

When the primary transmitter (137) is active and transmits a digital signal to a satellite, the burst from a non-reference station has a synchronization burst ($S_1$) and a data burst ($D_1$) as shown in FIG. 8(a). When the switching instruction for switching to the secondary transmitter (138) is provided, a non-reference station transmits an auxiliary burst ($S_2'$) as shown in FIG. 8(b), to the satellite, and the phase detection for the auxiliary burst is accomplished. The phase error signal for the auxiliary burst is stored in the secondary latch circuit (128) of FIG. 6 (see 210 of FIG. 7). When the reception of an auxiliary burst for W number of times (W is an integer) is acknowledged at the earth station (see 212 of FIG. 7), the phase and frequency variable oscillator (131) provides the adjusted clock signal for the secondary transmitter (138), indicating the phase change of the clock signal according to the content of the secondary latch circuit (128). Simultaneously, transmitter switching is accomplished. Thus, switching of the transmitters is performed without communication blocking.

Although the embodiment shown in FIGS. 5 and 6 describes transmitter switching in an earth station, it is equally true that receiver switching on a satellite is also possible in the the present invention.

As described above, the satellite communication system utilizing the present phase and frequency variable oscillator can switch a transmitter at an earth station, or a receiver on a satellite without communication blocking.

From the foregoing, it becomes apparent that a new and improved phase and frequency variable oscillator has been found. It should be understood that the embodiments disclosed are merely illustrative and are not intended to limit the scope of the invention. Reference should be made to the appended claims, therefore, rather than to the specification for determining the scope of the invention.

What is claimed is:

1. A phase and frequency variable oscillator comprising:
   (a) a fixed oscillator,
   (b) a quadrature hybrid circuit coupled with output of said fixed oscillator for providing a pair of quadrature phased signals,
   (c) a first control input for accepting a frequency control signal ($\Delta f_D$),
   (d) a second control input for accepting a phase control signal ($\Delta \phi_D$),
   (e) a control signal generator for providing a pair of quadrature phased control signals which depend upon said frequency control signal ($\Delta f_d$) and said phase control signal ($\Delta \phi_D$),
   (f) a first mixer for providing a product of one of the outputs of said quadrature hybrid circuit and one of the outputs of said control signal generator,
   (g) a second mixer for providing a product of another output of said quadrature hybrid circuit and another output of said control signal generator,
   (h) a power combiner for providing in-phase combination of outputs of said first mixer and said second mixer, and
   (i) an output terminal coupled with said power combiner to provide a controlled output signal, and wherein said control signal generator further comprises;
   (a) a fixed oscillator,
   (b) a variable frequency divider for dividing output frequency of said fixed oscillator,
   (c) an address counter which is incremented by output of said variable frequency divider and content of said address counter skips when a skipping signal is applied to the same,
   (d) a read-only-memory storing digital value equivalent to a sine wave and a cosine wave to provide a pair of quadrature phased output signals according to the output of said address counter, and being read according to the output of said address counter,
   (e) a digital/analog converter for converting digital outputs of said read-only-memory to analog signals which are said quadrature phased control signals, and
   (f) a control circuit for providing the divisor (M) which is applied to said variable frequency divider and said skipping signal for skipping said address counter according to a phase control signal ($\Delta \phi_D$) and a frequency control signal ($\Delta f_D$).

2. A non-blocking redundant switching system in a clock coherent satellite communication system comprising,
   an earth station having an antenna, a receiver coupled to said antenna, primary and secondary transmitters, a switching means for switching on one of said transmitters, a demodulator coupled with said receiver, a separator coupled with said demodulator to extract a phase error signal from a received data burst, a pair of latch circuits coupled to said separator for holding phase error signals from said separator for said primary and secondary transmitters, respectively, a phase and frequency variable oscillator for providing a controlled clock signal according to the output of a selected one of said latch circuits, a modulator receiving the output of said phase and frequency variable oscillator for modulating a transmission data signal and applying the modulated signal to one of said transmitters also coupled the said antenna,
   a satellite station having an antenna, primary and secondary receivers coupled with said antenna, a switching means for switching on one of said receivers, a regenerative repeater having a demodulator coupled with the output of said receiver, a clock recovery circuit coupled with the output of said receiver, and a decision circuit coupled to the output of said demodulator for recognizing the received signal, a fixed oscillator coupled with said decision circuit for providing a fixed clock signal thereto, a phase detector for comparing the phase of said fixed oscillator and the phase of the output of said clock recovery circuit to provide a phase error signal, a signal combiner coupled with said phase detector for combining said phase error signal and a transmission data burst, a transmitter having an output coupled with said antenna and an input coupled with said signal combiner through a modulator to transmit the combined signal through said antenna,
   wherein the phase error of the clock signal of said controlled clock signal for the primary and secondary transmitters in an earth station, and primary and secondary receivers on a satellite is detected by said phase comparator in said satellite station, and the detected phase error signals for the primary and secondary transmitters or receiver are sent to the earth station and are stored in the primary and secondary latch circuits, respectively, and said latch circuit are switched simultaneously with the switching of the transmitters or receivers, and wherein said phase and frequency variable oscillator comprises (a) a fixed oscillator, (b) a quadrature hybrid circuit coupled with the output of said fixed oscillator for providing a pair of quadrature phased signals, (c) a first control input for accepting a frequency control signal ($\Delta f_D$), (d) a second control input for accepting a phase control signal ($\Delta \phi_D$), (e) a control signal generator for providing a pair of quadrature phased control signals which depend upon said frequency control signal ($\Delta f_d$) and said phase control signal ($\Delta \phi_D$), (f) a first mixer for providing a product of one of the outputs of said quadrature hybrid circuit and one of the outputs of said control signal generator, (g) a second mixer for providing a product of another output of said quadrature hybrid circuit and another output of said control signal generator, (h) a power combiner for providing in-phase combination of outputs of said first mixer and said second mixer, and (i) an output terminal coupled with said power combiner to provide a controlled output signal.

3. A phase and frequency variable oscillator according to claim 1 wherein said pair of quadrature phased control signals provided by said control signal generator satisfy the following equations;

$$b \cos (2\pi \Delta f_D t + \Delta \phi_D) \text{ and } b \sin (2\pi \Delta f_D t + \Delta \phi_D)$$

where b is a constant.

4. A phase and frequency variable oscillator according to claim 1 wherein said divisor (M) satisfies equation $\Delta f_D = f_1/(LM)$, where $f_1$ is the frequency of said fixed oscillator, and L is the number of samples for a cycle of sine and cosine waveforms stored in said read-only-memory, and the skipping value ($\Delta N$) for said address counter satisfies equation $\Delta\phi_D=(2\pi/L)(\Delta N-1)$.

5. A phase and frequency variable oscillator according to claim 1, wherein a delay circuit and an attenuator are provided between said mixers and said in-phase combiner.

* * * * *